United States Patent
Losehand et al.

(10) Patent No.: US 6,888,430 B2
(45) Date of Patent: May 3, 2005

(54) INTEGRATED RADIOFREQUENCY CIRCUIT COMPONENT HAVING A TRIMMING DIODE CONTROLLED BY A TRIMMING VOLTAGE PROVIDED BY A D/A CONVERTER

(75) Inventors: Reinhard Losehand, München (DE); Raimund Peichl, Höhenkirchen-Siegerstbrunn (DE); Walter Zimmermann, Dorfen (DE)

(73) Assignee: Infineon Technologies AG, Munich (DE)

( * ) Notice: Subject to any disclaimer, the term of this patent is extended or adjusted under 35 U.S.C. 154(b) by 27 days.

(21) Appl. No.: 10/266,356

(22) Filed: Oct. 7, 2002

(65) Prior Publication Data

US 2003/0090347 A1 May 15, 2003

Related U.S. Application Data

(63) Continuation of application No. PCT/EP01/03845, filed on Apr. 4, 2001.

(30) Foreign Application Priority Data

Apr. 5, 2000 (EP) ............................................ 00107389

(51) Int. Cl.[7] .................................................. H03J 3/10
(52) U.S. Cl. .......................... 334/15; 333/174; 341/154
(58) Field of Search ........................... 334/15; 333/174; 341/154

(56) References Cited

U.S. PATENT DOCUMENTS 3,890,610 A  6/1975  Cahen
4,249,144 A  2/1981  Hurst et al. ............... 333/81 R

FOREIGN PATENT DOCUMENTS

| EP | 0 364 035 A2 | 4/1990 |
|----|--------------|--------|
| EP | 0 409 374 A2 | 1/1991 |
| FR | 2 582 150 | 11/1986 |
| JP | 63 107 311 A | 5/1988 |
| JP | 01 141 030 A | 6/1989 |
| JP | 07 122 931 A | 5/1995 |
| JP | 10 290 157 A | 10/1998 |
| JP | 11 340 736 A | 12/1999 |

OTHER PUBLICATIONS

Rohde, U. L.: "Microwave and Wireless Synthesizers", John Wiley & Sons, Inc., New York, 1997, pp. 62–64.

Primary Examiner—Benny Lee
(74) Attorney, Agent, or Firm—Laurence A. Greenberg; Werner H. Stemer; Ralph E. Locher

(57) ABSTRACT

An integrated component for radiofrequency applications has a resonant circuit with tuning diodes and trimming diodes that are connected in parallel. A programmable conductor network generates a trimming voltage at a trimming input that enables the production of a specific relationship between a voltage present at a tuning input and the resonant frequency of the resonant circuit.

7 Claims, 2 Drawing Sheets

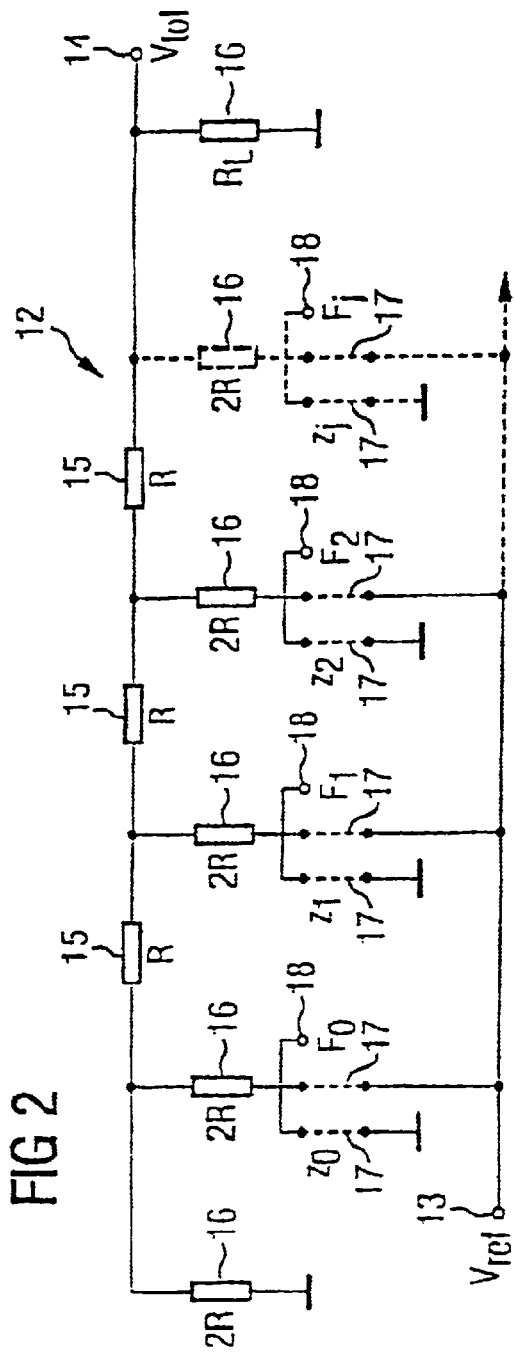
FIG 2
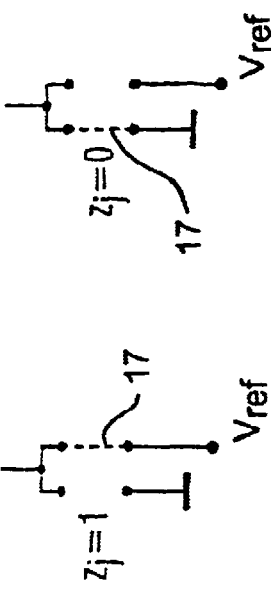
FIG 3A
FIG 3B

INTEGRATED RADIOFREQUENCY CIRCUIT COMPONENT HAVING A TRIMMING DIODE CONTROLLED BY A TRIMMING VOLTAGE PROVIDED BY A D/A CONVERTER

CROSS-REFERENCE TO RELATED APPLICATION

This application is a continuation of copending International Application No. PCT/EP01/03845, filed Apr. 4, 2001, which designated the United States and was not published in English.

BACKGROUND OF THE INVENTION

Field of the Invention

The invention relates to an integrated radiofrequency circuit component having a resonant circuit with a capacitor whose value can be set for a predetermined frequency range by a tuning diode.

To date, integrated components have not been used for resonant circuits or signal generators in the frequency range from 1.5 to 3 gigahertz. At the present time, either discrete coils and variable-capacitance diodes are employed or modules including a plurality of integrated components in a housing are used.

However, there is a need for integrated components with resonant circuits or signal generators. In particular, tunable, voltage-controlled integrated components are required. The customary circuits for voltage-controlled resonant circuits contain at least one tuning diode at which a DC voltage is present as bias voltage and is connected with a polarity opposite to the forward direction. The junction capacitance of the tuning diode is then a monotonic function of the bias voltage. The resonant circuit is therefore provided with a voltage-regulated capacitance that can be used to set the resonant frequency of the resonant circuit. In this case, the bias voltage serves for traversing the frequency band that can be utilized.

The specification of a finished integrated component having a resonant circuit also has a defined relationship between the bias voltage and the resonant frequency. However, since the electrical properties of all of the circuit elements can fluctuate in a tolerance range, the possibility for trimming the resonant frequency of the resonant circuit must exist.

From the book "Microwave and Wireless Synthesizers" by Ulrich L. Rohde, New York 1997, pages 62 and 63, it is known to perform the fine control of a resonant circuit by using a tuning diode at which a DC voltage is present as a bias voltage and is connected with a polarity opposite to the forward direction. Provided in parallel with the tuning diode are second and third tuning diodes that are connected with a polarity in opposition to one another and between which, a DC voltage is present as a bias voltage. In this manner, coarse control of the resonant frequency of the resonant circuit can be performed.

SUMMARY OF THE INVENTION

It is accordingly an object of the invention to provide an integrated component having a tunable and trimmable, voltage-controlled resonant circuit.

With the foregoing and other objects in view there is provided, in accordance with the invention, an integrated circuit component for radiofrequency applications in a predetermined frequency range. The circuit component includes: a resonant circuit including a tuning diode and a capacitor having a capacitance value being set by the tuning diode. The resonant circuit exhibits a resonant frequency, and the resonant circuit includes a trimming diode for compensating for production-dictated deviations in the resonant frequency of the resonant circuit. The circuit component also includes: a memory for storing a digital value; and a digital-to-analog converter for generating a trimming voltage from a reference voltage in accordance with the digital value stored in the memory. The trimming diode is controlled by the trimming voltage.

In accordance with an added feature of the invention, the tuning diode defines a first tuning diode; the resonant circuit includes a second tuning diode; and the first tuning diode and the second tuning diode are connected in series with reversed polities with respect to each other.

In accordance with an additional feature of the invention, a tuning voltage is applied between the first tuning diode and the second tuning diode.

In accordance with another feature of the invention, the trimming diode is connected in parallel with the capacitor of the resonant circuit.

In accordance with a further feature of the invention, the trimming diode defines a first trimming diode; the resonant circuit includes a second trimming diode; the first trimming diode and the second trimming diode are connected in series with reversed polities with respect to each other; and the first trimming diode and the second trimming diode are connected in parallel with the capacitor.

In accordance with a further added feature of the invention, the trimming voltage is applied between the first trimming diode and the second trimming diode.

In accordance with a further additional feature of the invention, the digital-to-analog converter is a network including resistors and fusible links; and the reference voltage is fed to the network.

In accordance with yet an added feature of the invention, the digital-to-analog converter includes a chain of series-path resistors and parallel-path resistors connected between the series-path resistors; the digital-to-analog converter includes fusible links; the digital-to-analog converter includes a ground line for receiving a ground potential; and the fusible links selectively connect the parallel path resistors to either the ground line or the reference voltage.

In accordance with yet an additional feature of the invention, each one of the series-path resistors has a first resistance value; and each one of the parallel-path resistors has a resistance value that is equal to twice the first resistance value.

The object of the invention is achieved by virtue of the fact that the production-dictated deviations in the resonant frequency of the resonant circuit can be compensated for by a second trimming diode, which is arranged in the resonant circuit and which is controlled by a trimming voltage generated by a digital-to-analog converter from a reference voltage in accordance with a digital value stored in a memory.

In the case of the inventive component, it suffices for the user to apply a predetermined reference voltage to a component input provided therefore. The component then generates the trimming voltage required for the respective compensation from the reference voltage. The digital value stored in the memory is expediently determined during a final measurement before the delivery of the component and is stored in the memory. It suffices, therefore, for the user to supply the component with a stable reference voltage in order to ensure the specified relationship between the tuning voltage and the resonant frequency.

In a preferred embodiment of the invention, the digital-to-analog converter is realized by a chain of series-path resistors, between which parallel-path resistors are connected, which can optionally be connected to a ground line or to the reference voltage via fusible links.

Using the fusible links and the resistors, it is possible to produce a simple programmable digital-to-analog converter that can be programmed by burning the fusible links.

Other features which are considered as characteristic for the invention are set forth in the appended claims.

Although the invention is illustrated and described herein as embodied in an integrated radiofrequency circuit component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a schematic diagram of a programmable digital-to-analog converter; and FIGS. 3a and 3b show the two different setting possibilities for the fusible links of the digital-to-analog converter shown in FIG. 2.

DESCRIPTION OF THE PREFERRED EMBODIMENTS

Figure 1:
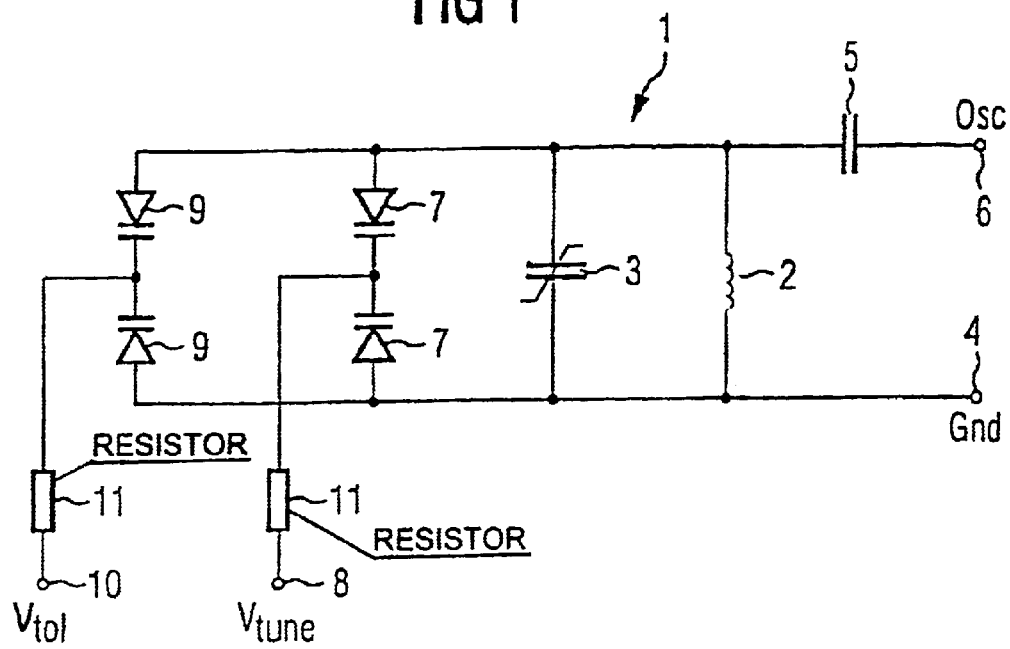
FIG. 1 is a schematic diagram of a tunable and trimmable, voltage-controlled resonant circuit.

Referring now to the figures of the drawing in detail and first, particularly, to FIG. 1 thereof, there is shown a tunable and trimmable, voltage-controlled resonant circuit 1. The resonant circuit 1 includes an inductor 2 and a capacitor 3. The resonant circuit 1 is connected to ground Gnd by a ground terminal 4. The resonant circuit 1 is connected to a signal output terminal 6 via a coupling capacitor 5. The resonant circuit 1 provides an output Osc at the signal output terminal 6. Two tuning diodes 7, which are connected in series with a polarity in opposition to one another, are connected in parallel with the capacitor 3. A tuning voltage $V_{tune}$ present at a tuning input 8 is present between the tuning diodes 7. Trimming diodes 9 connected with polarity in opposition to one another are likewise connected in parallel with the capacitor 3. A trimming voltage $V_{tol}$ present at a trimming input 10 is present between the trimming diodes 9. The tuning input 8 and the trimming input 10 are in each case protected by respective series resistors 11. The tuning diodes 7 and the trimming diodes 9 are so-called variable-capacitance diodes whose junction capacitance in the event of a polarity opposite to the forward direction is a monotonic function of the voltage present at the variable-capacitance diodes. In the case of the circuit configuration illustrated in FIG. 1, the tuning voltage $V_{tune}$ present at the tuning input 8 is so large that the tuning diodes 7 are set to an operating point at which the junction capacitance of the tuning diodes 7 is a monotonic function of the tuning voltage $V_{tune}$ present at the tuning input 8. Correspondingly, the trimming voltage $V_{tol}$ present at the trimming input 10 sets the trimming diodes 9 to an operating point at which the junction capacitance of the trimming diodes 9 is a monotonic function of the trimming voltage $V_{tol}$. Since the operating points of the tuning diodes 7 and the trimming diodes 9 are changed only slightly by the AC signal generated by the resonant circuit 1, the capacitance of the tuning diodes 7 and of the trimming diodes 9 can be regarded essentially as being constant. Consequently, the total capacitance in the resonant circuit 1 can be controlled by the tuning voltage $V_{tune}$ and the trimming voltage $V_{tol}$. In particular, it is possible to alter the resonant frequency of the resonant circuit 1 by altering the tuning voltage.

In the case of an integrated component, it is desirable for there to be a specified relationship between the respective tuning voltage and the resonant frequency. However, the electrical properties of the inductor 2, the capacitor 3, and also of the tuning diodes 7 fluctuate in a production-dictated manner within specific predetermined tolerance ranges. It is therefore, advantageous if a possibility for compensating for these fluctuations exists. This purpose is served by the trimming diodes 9, which compensate for the manufacturing-dictated tolerances in accordance with the trimming voltage $V_{tol}$, and in this way, ensure the specified relationship between the trimming voltage and the resonant frequency.

FIG. 2 shows a digital-to-analog converter that can be integrated into the component and serves for generating, from a reference voltage $V_{ref}$ present at a reference input 13, the trimming voltage $V_{tol}$ at a trimming output 14.

The digital-to-analog converter 12 has an inversely operated programmable conductor network with a chain of series-path resistors 15, which is connected to the trimming output 14. Parallel-path resistors 16 are shunt-connected with respect to the series-path resistors 15. Each of the series path resistors 15 has a resistance value of R, while each of the parallel-path resistors 16 has a resistance value of 2R.

The remaining parallel-path resistors 16 can optionally be connected to ground or to the reference input via fusible links 17 present in pairs. The term, "fusible links" 17 is to be understood to mean both so-called fuses and antifuses. Moreover, fusing inputs 18 are provided, which serve for burning the fusible links 17. For this purpose, voltages whose magnitude is chosen such that in each case one of the two fusible links 17 is severed or closed are applied to the fusing inputs 18 and the reference input 13.

FIGS. 3A and 3B illustrate possible switching states. The switching state in FIG. 3A is intended to represent a logic 1, while the switching state in FIG. 3B represents a logic 0. FIG. 3A shows a dashed line indicating that the fusable link 17 enables a connection to the reference voltage $V_{ref}$, while there is no longer a connection to ground. This state is associated with an impedance variable zj=1. FIG. 3B shows a dashed line indicating that the fusable link 17 enables a connection to ground, while there is no longer a connection to the reference voltage $V_{ref}$. This state is associated with an impedance variable zj=0. For a conductor network with 2n+1 series-path resistors 15 and parallel-path resistors 16, and 2n fusible links 17, which represent an n-bit digital-to-analog converter, the following relationship then holds true:

$$V_{tol} = \frac{V_{ref}}{2^n} \cdot \frac{R_L}{R + R_L} \cdot Z$$

where:

$$Z = \sum_{j=0}^{n-1} z_j 2^j.$$

The impedance value Z obtained from the equation on line 10 will depend on the impedance variables $z_0$, $z_1$, $z_2$, ... $z_j$ associated with the digital-to-analog converter shown in FIG. 2. The impedance variables $z_0$, $z_1$, $z_2$, ... $z_j$ are dependent upon which of the fusable links 17 have been blown as has been described with reference to FIGS. 3A, 3B. The term "n" appearing in the equation on line 10 is equal to the number of branches with parallel-path resistors 16 in the digital-to-analog converter 12 shown in FIG. 2. The trimming voltage $V_{tol}$ is obtained by evaluating the equation on line 5 of page 11 using the impedance value Z obtained from the equation on line 10. In that evaluation, $V_{ref}$ is the reference voltage present at the reference input 13, R is the value of the series-path resistors 15 and $R_L$ is the resistance of the parallel-path resistor 16 shown at the far right in FIG. 2.

In the context of manufacturing the integrated component, in a final measurement, the respective relationship between the tuning voltage and the resonant frequency of the resonant circuit 1 can be determined and can be compensated for by burning the fusible links 17. It is particularly advantageous that the trimming is effected using concomitantly integrated circuit components.

We claim:

1. An integrated circuit component for radiofrequency applications in a predetermined frequency range, the circuit component comprising:

a first terminal for a tuning voltage;

a second terminal for a trimming voltage;

a resonant circuit including an inductor, a tuning diode and a capacitor having a capacitance value being set by said tuning diode, said tuning diode connected to said first terminal, said resonant circuit exhibiting a resonant frequency, said resonant circuit including a trimming diode for compensating for production-dictated deviations in said resonant frequency of said resonant circuit, said trimming diode connected to said second terminal; and a digital-to-analog converter for generating the trimming voltage from a reference voltage and a supply voltage in accordance with a digital value;

said digital-to-analog converter having an output connected to said second terminal;

said digital-to-analog converter including a chain of series-path resistors and parallel-path resistors connected between said series-path resistors;

said digital-to-analog converter including fusible links;

said digital-to-analog converter including a ground line for receiving a ground potential and a reference voltage line for receiving the reference voltage;

said fusible links connected to at least one of said parallel-path resistors;

said fusible links configured for selectively connecting said parallel path resistors to a line selected from a group consisting of said ground line and said reference voltage line; and said trimming diode being controlled by the trimming voltage.

2. The component according to claim 1, wherein: said tuning diode defines a first tuning diode; said resonant circuit includes a second tuning diode; and said first tuning diode and said second tuning diode are connected in series with reversed polarities with respect to each other.

3. The component according to claim 2, wherein: the tuning voltage is applied between said first tuning diode and said second tuning diode.

4. The component according to claim 1, wherein: said trimming diode is connected in parallel with said capacitor of said resonant circuit.

5. The component according to claim 4, wherein:

said trimming diode defines a first trimming diode;

said resonant circuit includes a second trimming diode;

said first trimming diode and said second trimming diode are connected in series with reversed polarities with respect to each other; and said first trimming diode and said second trimming diode are connected are connected in parallel with said capacitor.

6. The component according to claim 5, wherein: the trimming voltage is applied between said first trimming diode and said second trimming diode.

7. The component according to claim 1, wherein:

each one of said series-path resistors has a first resistance value; and each one of said parallel-path resistors has a resistance value that is equal to twice the first resistance value.

* * * * *